(12) United States Patent
Gabrovski et al.

(10) Patent No.: US 12,387,017 B1
(45) Date of Patent: Aug. 12, 2025

(54) NON-DETERMINISM TESTING FOR SOFTWARE FOR CONTROLLING AUTONOMOUS VEHICLES

(71) Applicant: Waymo LLC, Mountain View, CA (US)

(72) Inventors: Aleksandar Rumenov Gabrovski, Mountain View, CA (US); Andrew Hughes Chatham, San Francisco, CA (US)

(73) Assignee: Waymo LLC, Mountain View, CA (US)

( * ) Notice: Subject to any disclaimer, the term of this patent is extended or adjusted under 35 U.S.C. 154(b) by 1308 days.

(21) Appl. No.: 16/174,890

(22) Filed: Oct. 30, 2018

(51) Int. Cl.
*G06F 30/20* (2020.01)
*G06F 8/71* (2018.01)

(52) U.S. Cl.
CPC ............... *G06F 30/20* (2020.01); *G06F 8/71* (2013.01)

(58) Field of Classification Search
CPC .................................. G06F 30/20; G06F 8/71
See application file for complete search history.

(56) References Cited

U.S. PATENT DOCUMENTS

| | | | |
|---|---|---|---|
| 8,732,670 | B1 | 5/2014 | Daudel et al. |
| 9,105,189 | B2 | 8/2015 | Rubin et al. |
| 9,216,745 | B2 | 12/2015 | Beardsley et al. |
| 2005/0160404 | A1 | 7/2005 | Nachmanson et al. |
| 2006/0259551 | A1* | 11/2006 | Caldwell, Jr. ........... H04L 51/12 709/204 |
| 2009/0319832 | A1* | 12/2009 | Zhang ................. G06F 11/3684 714/38.1 |
| 2016/0224453 | A1* | 8/2016 | Wang ........................ G06F 8/71 |
| 2016/0314224 | A1 | 10/2016 | Wei et al. |
| 2017/0139411 | A1 | 5/2017 | Hartung et al. |
| 2018/0137756 | A1* | 5/2018 | Moosaei ............. G08G 1/0965 |
| 2019/0303759 | A1* | 10/2019 | Farabet ................... G06F 9/455 |
| 2020/0159570 | A1* | 5/2020 | Askeland ................ H04W 4/40 |
| 2020/0159685 | A1* | 5/2020 | Askeland ................ G06F 11/34 |
| 2021/0311827 | A1* | 10/2021 | Lu ............................ G11C 7/04 |
| 2023/0112050 | A1* | 4/2023 | Askeland ............... G07C 5/085 701/27 |

OTHER PUBLICATIONS https://dzone.com/articles/eradicating-non-determinism, downloaded Aug. 28, 2018, 8 pgs.

* cited by examiner

*Primary Examiner* — Kevin L Young
*Assistant Examiner* — Kimberly L Jordan
(74) *Attorney, Agent, or Firm* — Botos Churchill IP Law LLP (57) ABSTRACT

The disclosure relate to detecting differences indicative of non-determinism in software used to control autonomous vehicles. For instance, a simulation may be run using the software at least two times. The output of the simulations may be tracked. The output of the simulations includes messages may be generated by a decision making module of the software that affect vehicle behavior. A pair of messages generated from each of the at least two times the simulation is run may be compared. Based on the comparison, a difference indicative of non-determinism in the software may be detected.

24 Claims, 4 Drawing Sheets

To: Human Operator A
From: Non-Determinism Testing

WARNING! Version X may have introduced non-determinism.

Message Name: Y
Field: Z
Software Module: Perception System Software Module
Rate of differences changed from 1.25% to 13.93% with Zscore 28.72

Congratulations! Version X reduced non-determinism.

Message Name: A
Field: B
Software Module: Perception System Software Module
Rate of difference changed from 4.99% to 0.00% with Zscore -6.41

400
FIGURE 4

NON-DETERMINISM TESTING FOR SOFTWARE FOR CONTROLLING AUTONOMOUS VEHICLES

BACKGROUND

Autonomous vehicles, for instance, vehicles that do not require a human driver, can be used to aid in the transport of passengers or items from one location to another. Such vehicles may operate in a fully autonomous mode where passengers may provide some initial input, such as a pickup or destination location, and the vehicle maneuvers itself to that location, for instance, by determining and following a route which may require the vehicle to respond to and interact with other road users such as vehicles, pedestrians, bicyclists, etc. It is critical that the autonomous control software used by these vehicles to operate in the autonomous mode is tested and validated before such software is actually used to control the vehicles in areas where the vehicles are interacting with other objects.

BRIEF SUMMARY

One aspect of the disclosure provides a method of detecting differences indicative of non-determinism in software used to control autonomous vehicles. The method includes running, by one or more processors, a simulation using the software at least two times; tracking, by the one or more processors, output of the simulations, wherein the output of the simulations includes messages generated by a decision making module of the software which affect vehicle behavior; comparing, by the one or more processors, a pair of messages generated from each of the at least two times the simulation is run; and based on the comparison, detecting, by the one or more processors, a difference indicative of non-determinism in the software.

In one example, the method also includes, prior to comparing the pair of messages, filtering the pair of messages to remove fields unrelated to non-determinism such that only corresponding fields related to non-determinism are compared when comparing the messages. In another example, the difference indicative of non-determinism is a first in time difference for the at least two times the simulation is run. In another example, comparing the pair of messages is based on a tolerance for acceptable differences between corresponding fields of the pair of messages. In another example, the method also includes identifying a software module of the software that caused the software to behave non-deterministically based on the difference. In another example, the method also includes determining based on the difference identifying a percentage of simulations for which the software behaves non-deterministically. In another example, the method also includes flagging the pair of messages for review. In another example, the software is a latest version of the software, and the method further comprising, aggregating differences identified from prior versions of the software over time in order to detect anomalies in the latest version of the software. In this example, a detected anomaly indicates an increase in non-determinism from the latest version of the software over the prior versions of the software. Alternatively, a detected anomaly indicates a decrease in non-determinism from the latest version of the software over the prior versions of the software. In another example, the decision making module of the software is a planning system configured to generate trajectories for a vehicle to follow. In another example, the decision making module of the software is a perception system configured to detect and identify objects in a vehicle's environment using sensor data generated by sensors of the vehicle. In this example, the decision making module of the software is a behavior prediction system configured to predict future behaviors of objects detected in an autonomous vehicle's environment from sensor data generated by sensors of the vehicle. In this example, the decision making module of the software is a construction zone detection system configured to detect construction zones from sensor data generated by sensors of an autonomous vehicle. In another example, the decision making module of the software is an emergency vehicle detection system configured to detect emergency vehicles from sensor data generated by sensors of an autonomous vehicle. In another example, the decision making module of the software is a control system configured to control movement of an autonomous vehicle in order to follow a trajectory.

Another aspect of the disclosure provides a system for detecting differences indicative of non-determinism in software used to control autonomous vehicles. The system includes one or more processors configured to: run a simulation using the software at least two times; track output of the simulations, wherein the output of the simulations includes messages generated by a decision making module of the software which affect vehicle behavior; compare a pair of messages generated from each of the at least two times the simulation is run; and based on the comparison, detect a difference indicative of non-determinism in the software.

In one example, the one or more processors are further configured to, prior to comparing the pair of messages, filtering the pair of messages to remove fields unrelated to non-determinism such that only corresponding fields related to non-determinism are compared when comparing the messages. In another example, the difference indicative of non-determinism is a first in time difference for the at least two times the simulation is run. In another example, comparing the pair of messages is based on a tolerance for acceptable differences between corresponding fields of the pair of messages.

DETAILED DESCRIPTION

Overview

The technology relates to testing autonomous vehicle software for non-determinism, that is, situations in which the software effectively makes different driving decisions or behaviors for the vehicle under the same circumstances. This is critically important to being able to reliably test the software in a given simulation. These situations may be caused by changes to the software which cause such unintended consequences.

To detect such situations, multiple instances of the same simulation are run to test the software's behavior in "real world situations". During each simulation, the output messages of various systems, such as the output of the various modules important to decision making, including, for instance, the perception system and the planner system as well as vehicle controllers (that drive along the plan), behavior predictors for other objects, construction zone detectors, emergency vehicles detectors etc., may be tracked. The output may then be compared to identify and flag any differences for review. This data may be recorded over the course of many simulations running different versions of software. This data may be aggregated and used to generate statistics in order to detect anomalies. Once an anomaly is detected, the software, modules, messages, and fields which caused the anomaly may be flagged for further review. Thus, the features described herein allow for the detection of non-determinism each time a change is made to autonomous vehicle software.

Example Systems

Figure 1:
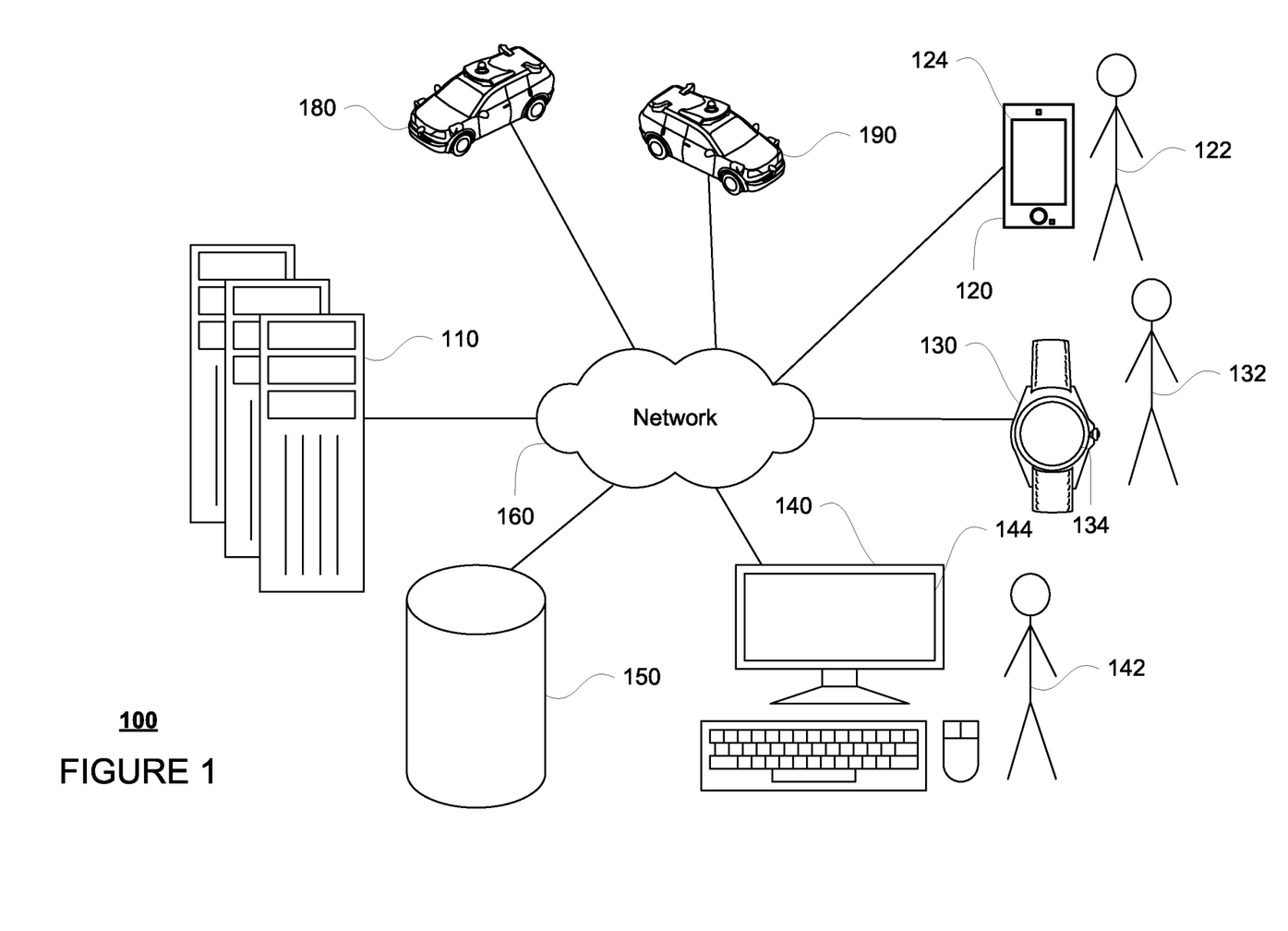
FIG. 1 is a pictorial diagram of an example system in accordance with aspects of the disclosure.
Figure 2:
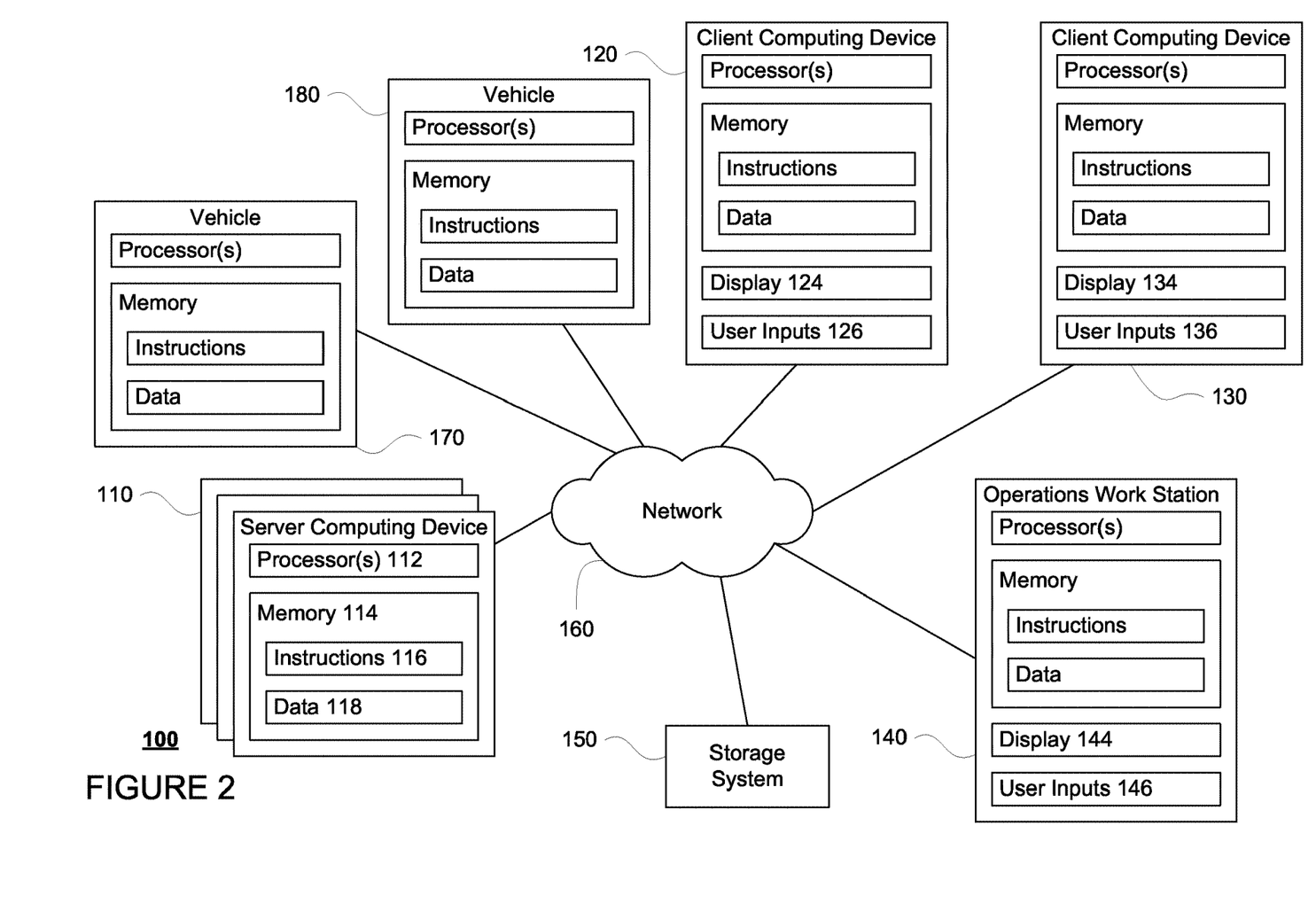
FIG. 2 is a functional diagram of the system of FIG. 1 in accordance with aspects of the disclosure.

FIGS. 1 and 2 are pictorial and functional diagrams, respectively, of an example system 100 that includes a plurality of computing devices 110, 120, 130, 140, a storage system 150, and autonomous vehicles 170, 180 connected via a network 160. Although only a few vehicles and computing devices are depicted for simplicity, a typical system may include significantly more.

Computing devices 110 may include one or more processors 112 and memory 114. The memory 114 stores information accessible by the one or more processors 112, including instructions 116 and data 118 that may be executed or otherwise used by the one or more processors 112. The memory 114 may be of any type capable of storing information accessible by the processor, including a computing device-readable medium, or other medium that stores data that may be read with the aid of an electronic device, such as a hard-drive, memory card, ROM, RAM, DVD or other optical disks, as well as other write-capable and read-only memories. Systems and methods may include different combinations of the foregoing, whereby different portions of the instructions and data are stored on different types of media.

The instructions 116 may be any set of instructions to be executed directly (such as machine code) or indirectly (such as scripts) by the processor. For example, the instructions may be stored as computing device code on the computing device-readable medium. In that regard, the terms "software," "instructions" and "programs" may be used interchangeably herein. The instructions may be stored in object code format for direct processing by the processor, or in any other computing device language including scripts or collections of independent source code modules that are interpreted on demand or compiled in advance. Functions, methods and routines of the instructions are explained in more detail below.

The data 118 may be retrieved, stored or modified by processor 112 in accordance with the instructions 116. For instance, although the claimed subject matter is not limited by any particular data structure, the data may be stored in computing device registers, in a relational database as a table having a plurality of different fields and records, XML documents or flat files. The data may also be formatted in any computing device-readable format.

The one or more processors 120 may be any conventional processors, such as commercially available CPUs. Alternatively, the one or more processors may be a dedicated device such as an ASIC or other hardware-based processor. Although FIG. 1 functionally illustrates the processor, memory, and other elements of computing devices 110 as being within the same block, it will be understood by those of ordinary skill in the art that the processor, computing device, or memory may actually include multiple processors, computing devices, or memories that may or may not be stored within the same physical housing. For example, memory may be a hard drive or other storage media located in a housing different from that of computing devices 110. Accordingly, references to a processor or computing device will be understood to include references to a collection of processors or computing devices or memories that may or may not operate in parallel.

Computing devices 110 may also include one or more wireless network connections to facilitate communication with other computing devices, such as the client computing devices and server computing devices described in detail below. The wireless network connections may include short range communication protocols such as Bluetooth, Bluetooth low energy (LE), cellular connections, as well as various configurations and protocols including the Internet, World Wide Web, intranets, virtual private networks, wide area networks, local networks, private networks using communication protocols proprietary to one or more companies, Ethernet, WiFi and HTTP, and various combinations of the foregoing.

As shown in FIG. 1, each of computing devices 110, 120, 130, 140 and vehicles 180, 190 may include one or more processors, memory, data and instructions. Such processors, memories, data and instructions may be configured similarly to one or more processors 112, memory 114, and instructions 116, and data 118 of computing device 110.

The network 160, and intervening nodes, may include various configurations and protocols including short range communication protocols such as Bluetooth, Bluetooth LE, the Internet, World Wide Web, intranets, virtual private networks, wide area networks, local networks, private networks using communication protocols proprietary to one or more companies, Ethernet, WiFi and HTTP, and various combinations of the foregoing. Such communication may be facilitated by any device capable of transmitting data to and from other computing devices, such as modems and wireless interfaces.

In one example, one or more computing devices 110 may include one or more server computing devices having a plurality of computing devices, e.g., a load balanced server farm, that exchange information with different nodes of a network for the purpose of receiving, processing and transmitting the data to and from other computing devices. For instance, one or more computing devices 110 may include one or more server computing devices that are capable of communicating with computing devices of vehicles 170, 180 and/or computing devices 120, 130, 140 via the network 160.

For example, vehicles 170, 180, may be a part of a fleet of autonomous vehicles that can be dispatched by server computing devices to various locations. In this regard, the server computing devices 110 may function as a validation computing system which can be used to validate autonomous control software which vehicles such as vehicle 100 and vehicle 100A may use to operate in an autonomous driving mode. In addition, server computing devices 110 may use network 160 to transmit and present information to a user, such as user 122, 132, 142 on a display, such as displays 124, 134, 144 of computing devices 120, 130, 140. In this regard, computing devices 120, 130, 140 may be considered client computing devices.

As shown in FIG. 1, each client computing device 120, 130, 140 may be a personal computing device intended for use by a user 122, 132, 142, and have all of the components normally used in connection with a personal computing device including a one or more processors (e.g., a central processing unit (CPU)), memory (e.g., RAM and internal hard drives) storing data and instructions, a display such as displays 124, 134, 144 (e.g., a monitor having a screen, a touch-screen, a projector, a television, or other device that is operable to display information), and user input devices 126, 136, 146 (e.g., a mouse, keyboard, touchscreen or microphone). The client computing devices may also include a camera for recording video streams, speakers, a network interface device, and all of the components used for connecting these elements to one another.

Although the client computing devices 120, 130, and 140 may each comprise a full-sized personal computing device, they may alternatively comprise mobile computing devices capable of wirelessly exchanging data with a server over a network such as the Internet. By way of example only, client computing device 120 may be a mobile phone or a device such as a wireless-enabled PDA, a tablet PC, a wearable computing device or system, or a netbook that is capable of obtaining information via the Internet or other networks. In another example, client computing device 130 may be a wearable computing system, shown as a wristwatch as shown in FIG. 1. As an example the user may input information using a small keyboard, a keypad, microphone, using visual signals with a camera, or a touch screen.

As with memory 114, storage system 150 can be of any type of computerized storage capable of storing information accessible by the server computing devices 110, such as a hard-drive, memory card, ROM, RAM, DVD, CD-ROM, write-capable, and read-only memories. In addition, storage system 150 may include a distributed storage system where data is stored on a plurality of different storage devices which may be physically located at the same or different geographic locations. Storage system 150 may be connected to the computing devices via the network 160 as shown in FIGS. 1 and 2, and/or may be directly connected to or incorporated into any of the computing devices 110, 120, 130, 140, etc.

Storage system 150 may store various types of information as described in more detail below. This information may be retrieved or otherwise accessed by a server computing device, such as one or more server computing devices 110, in order to perform some or all of the features described herein. For instance, storage system 150 may store log data. This log data may include, for instance, sensor data generated by a perception system, such as a perception system of vehicle 170 or 180. The perception system may include a plurality of sensors that generate sensor data. As an example, the sensor data may include raw sensor data as well as data identifying defining characteristics of perceived objects such as shape, location, orientation, speed, etc. of objects such as vehicles, pedestrians, bicyclists, vegetation, curbs, lane lines, sidewalks, crosswalks, buildings, etc. The log data may also include "event" data identifying different types of events such as collisions or near collisions with other objects, planned trajectories describing a planned geometry and/or speed for a potential path of the vehicle 170 or 180, actual locations of the vehicles at different times, actual orientations/headings of the vehicle at different times, actual speeds, accelerations and decelerations of the vehicle at different times, classifications of and responses to perceived objects, behavior predictions of perceived objects, status of various systems (such as acceleration, deceleration, perception, steering, signaling, routing, power, etc.) of the vehicle at different times including logged errors, inputs to and outputs of the various systems of the vehicle at different times, etc. As such, these events and the sensor data may be used to "recreate" the vehicle's environment, including perceived objects, and behavior of a vehicle in a simulation.

In addition, the storage system 150 may also store autonomous control software which is to be used by vehicles, such as vehicle 100, to operate a vehicle in an autonomous driving mode. This autonomous control software stored in the storage system 150 may be a version which has not yet been validated. Once validated, the autonomous control software may be sent, for instance, to memory 114 of vehicle 100 in order to be used by computing devices of vehicles 180, 190 in order to control vehicles 180, 190 in an autonomous driving mode.

As an example, a perception system software module may use sensor data generated by one or more sensors of an autonomous vehicle, such as cameras, LIDAR sensors, radar units, sonar units, etc., to detect and identify objects and their characteristics. These characteristics may include location, type, heading, orientation, speed, acceleration, change in acceleration, size, shape, etc. In some instances, characteristics may be input into a behavior prediction system software module which uses various models based on object type to output a predicted future behavior for a detected object. In other instances, the characteristics may be put into one or more detection system software modules, such as a construction zone detection system software module configured to detect construction zones from sensor data generated by the one or more sensors of the vehicle as well as an emergency vehicle detection system configured to detect emergency vehicles from sensor data generated by sensors of the vehicle. Each of these detection system software modules may uses various models to output a likelihood of a construction zone or an object being an emergency vehicle. Detected objects, predicted future behaviors, various likelihoods from detection system software modules, map information identifying the vehicle's environment, and a destination for the vehicle may be input into a planning system software module. The planning system may use this input to generate trajectories for the vehicle to follow for some brief period of time into the future. A control system software module may be configured to control movement of the vehicle, for instance by controlling braking, acceleration and steering of the vehicle, in order to follow a trajectory.

The storage system 150 may also store information related to the output of simulations run using the autonomous vehicle control software. For instance, the storage system may store identified differences for different simulations and related information, including for instance, message name, message type, field, as well as the software module that generated the message as discussed further below. In addition, for a given version of the software, the storage system 150 may store statistics about what percentage of the time the software behaves non-deterministically as well as which modules and messages are responsible for that behavior may be identified. The storage system may also store flagged anomalies as well as changes in non-deterministic outcomes of across different versions of the software as discussed further below.

Example Methods

In addition to the operations described above and illustrated in the figures, various operations will now be described. It should be understood that the following operations do not have to be performed in the precise order described below. Rather, various steps can be handled in a different order or simultaneously, and steps may also be added or omitted.

In order to test and/or validate the autonomous control software which will be stored in memory 114 for use by the computing devices of vehicle 170, 180, the server computing devices 110 may run various simulations. These simulations may be log based simulations that are generated from the information stored in the aforementioned log data of storage system 150. In this regard, the server computing devices 110 may access the storage system 150 in order to retrieve the log data and run a simulation. For instance, a portion of the log data corresponding to a minute in real time of an autonomous vehicle that generated the log data may be retrieved from the storage system. This portion of log data may be "hand" selected by human operators and/or computing devices based on the types of events recorded in the logs or more randomly, for instance, by selecting 1% or more or less of all autonomous driving logs.

The retrieved portion of log data may be used to run an initial simulation. When running the autonomous control software through the portion of log data, the details (sensor data and events) of the log data may be used to generate a simulation. In other words, the sensor data of the portion of log data may simply be "played" as input to the perception system of a simulated vehicle controlled by the autonomous control software. In this regard, the autonomous control software "experiences" or processes the log data as if the autonomous control software was actually being run on vehicle 170 or 180. In other words, the simulation may include data defining characteristics of objects such as shape, location, orientation, speed, etc. of objects such as vehicles, pedestrians, bicyclists, vegetation, curbs, lane lines, sidewalks, crosswalks, buildings, etc. defined by the sensor data of the log data. Further, the simulation may include characteristics for a virtual vehicle, corresponding to vehicle 170 or 180, including the virtual vehicle's shape, location, orientation, speed, etc. defined by the events of the log data.

Figure 3:
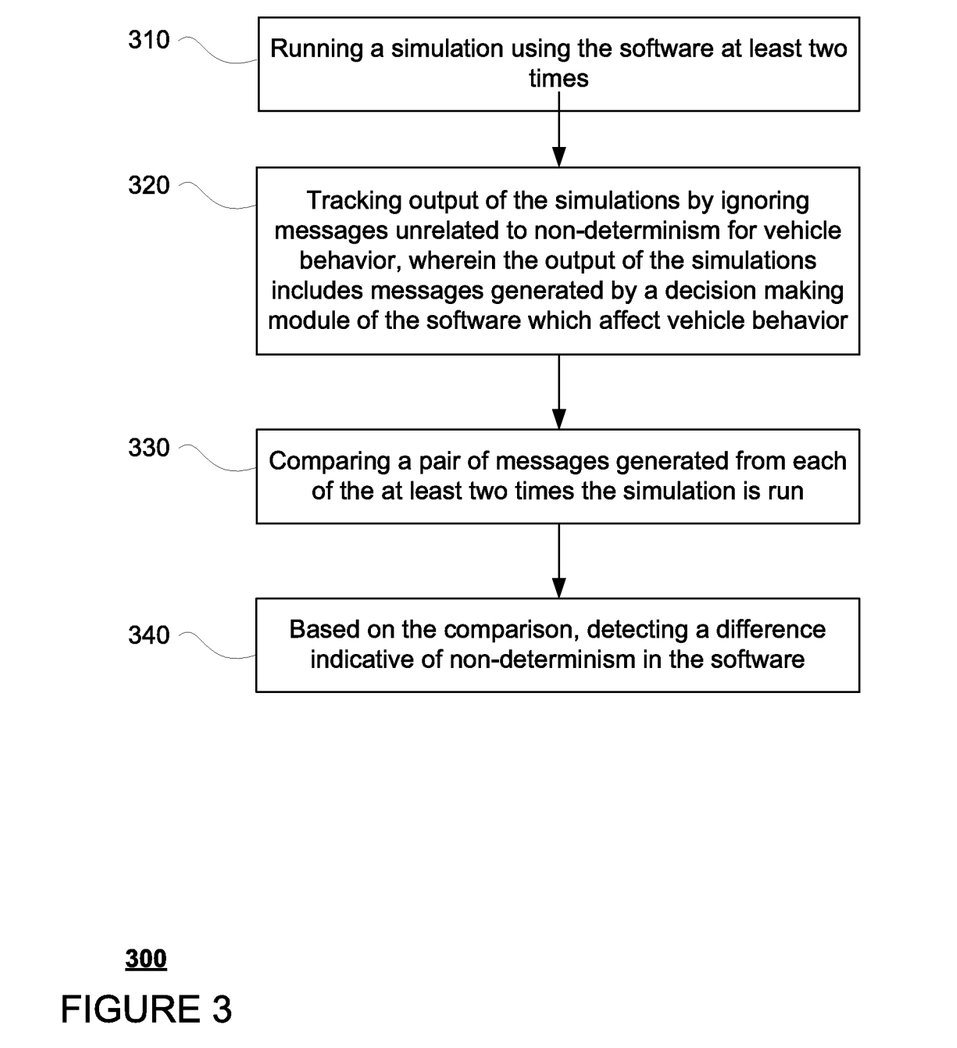
FIG. 3 is an example graphical representation in accordance with aspects of the disclosure.

FIG. 3 includes an example flow diagram 300 of some aspects of detecting differences indicative of non-determinism in software used to control autonomous vehicles, which may be performed by one or more processors such as processors of computing devices 110. For instance, in order to detect such differences, the server computing devices may run the same simulation two or more times, and compare the results of those simulations at block 310. These two or more simulations may be the same or that is run using the same log or other data. In addition, these two or more simulations may be run using the same version of the autonomous vehicle control software At block 320, the output of the simulations is tracked. This may include tracking or recording messages generated by a decision making module of the software related to controlling vehicle behavior. This may also include ignoring messages unrelated to non-determinism for vehicle behavior. For instance, during a simulation, the output of various software modules, including those discussed above, may be tracked. These may include all types of messages, including those that are unrelated to controlling the vehicle decisions or behavior. As such, the messages may be filtered such that certain types of messages are ignored, disregarded or otherwise not tracked. For instance, messages that are unrelated to the behavior or the vehicle, such as debugging messages or graphical representations of the vehicle's internal state for engineers or messages that are not consumed by any decision making part of the software. This filtering may avoid alerting on information that is known to be non-deterministic by design but do not affect vehicle behavior which, in turn, may reduce processing costs for later comparisons of the messages and fields.

The messages remaining after the aforementioned filtering may be even further filtered such that certain fields of messages are ignored, disregarded or otherwise not tracked. For instance, fields which would not affect driving decisions, such as certain types of identifiers including process identifiers, globally unique identifiers and others which do not affect decision making, client names (the names of machines running the simulation), or messages that might change but are not relevant to determinism. Again, this filtering may avoid alerting on information that is known to be non-deterministic by design but do not affect vehicle behavior which, in turn, may reduce processing costs for later comparisons of the messages and fields.

At block 330, a pair of messages generated from each of the at least two times the simulation is run is compared. Because messages are compared between two or more identical simulations running identical versions of the autonomous vehicle control software, the same messages should be generated by the various software modules of the autonomous vehicle control software at the same point in time in the simulations. Thus, the output of each of such simulations should have corresponding messages, at least up until some point of non-determinism occurs in the two or more simulations. In other words, after the aforementioned filtering, the remaining corresponding messages and/or fields may then be compared between two or more simulations run using the same software. These comparisons may be performed on a field by field basis between corresponding messages of the two or more simulations. Such comparisons may identify, for instance, differences in levels of detail for perceived objects, differences in behavioral responses of the vehicle (for instance, trajectories generated by the planning system module), etc.

At block 340, based on the comparison, a difference indicative of non-determinism in the software is detected. For instance, only the first difference in time between fields of corresponding messages of two or more simulations may be identified as relevant to non-determinism. Identifying only the first difference is important, because thereafter, the messages are likely to become very different because the software is behaving non-deterministically. For instance, one non-deterministic message may be the input to multiple software modules, thus causing those software module to produce additional non-deterministic output, causing a cascade of differences. For example, if a perception message is non-deterministic, that may cause the planned trajectory to be non-deterministic on subsequent iterations, which may cause the vehicle position to be different, etc. So to determine the root cause of non-determinism it makes sense to look at the first difference found.

However, to avoid being overly inclusive, tolerances can be set to identify only certain amounts of differences which are likely to be problematic, and thereby ignore acceptable differences. For instance, differences between certain fields may be ignored if they are the same to some decimal point value (for instance, 0.00000001). As an example, acceleration command differences that are smaller than $1e^{-10}$ may be ignored since those differences will not have a noticeable effect on where the vehicle goes. The reason such diffs can show up in the first place is because the simulation may be in the cloud on different processing architectures. For instance, the one or more server computing devices may consist of heterogeneous machines that may be years apart in the processing architecture they contain, which is one cause of tiny floating point differences. As such, these small differences may be ignored since they are somewhat expected at that level of sensitivity but at the same time they may not, but in some outlying instances could, actually affect the behavior of an autonomous vehicle in noticeable ways. In other words, there is a tradeoff between false positives and false negatives which is addressed by deciding when to ignore such differences.

These identified differences for different simulations and related information, including for instance, message name, message type, field, as well as the software module that generated the message may be recorded, stored in storage system 150, and used to determine non-determinism statistics for the software. For instance, for a given version of the software, statistics about what percentage of the time the software behaves non-deterministically as well as which modules and messages are responsible for that behavior may be identified. As an example, given 100 simulation scenarios, if 50 simulations demonstrate no differences, then 50 simulations would demonstrate non-deterministic behavior. These 50 simulations may be further categorized in order to identify which software module, for instance planner or perception, was responsible for the non-deterministic behavior. This, in turn, may be used to flag the messages for attention by an engineer in order to try and improve the software.

In addition, this data may be recorded over the course of many simulations running different versions of software. This data may be aggregated, for instance, by determining the distribution (or, for instance, the average) and standard deviations. The non-determinism statistics for the latest version of the software may then be compared to this distribution in order to detect anomalies. For instance, if an increase or decrease in non-determinism between the last version and the distribution is greater than or equal to a threshold value this may indicate an anomaly. For another instance, anomalies may be identified by using change point detection algorithms or anomaly detection algorithm.

More particularly, anomalies may be detected by looking for a number of standard deviations away from the mean or distribution of prior simulations. In other words, a threshold value may be determined based on a number of standard deviations from the recent history of the simulations, such as greater than 4 standard deviations from the recent history. When picking the recent history over which to compute the distribution there may be trade offs made. For instance, when the history is too long, the history may capture multiple anomalies and compute the distribution over these anomalies. This would cause the standard deviation to be very high and make the system unlikely to alert on real regressions. At the same time, when the history is too short, the computed standard deviation will be too short and the true variance of the signal may not be captured. This may lead to a higher false positive rate. In addition, very rare non-determinism may not be properly captured by this approach. For example, if 90% of the time only 1 of 100 scenarios shows a certain kind of non-determinism and 10% of the time, 2 scenarios show this non-determinism, the system may alert incorrectly on the cases where there are 2 scenarios (since that's a 100% increase in the rate of the non-determinism for that cause).

Once an anomaly is detected, the software, modules, messages, and fields which caused the anomaly may be flagged for further review. This may include, for instance, sending a message, such as an email, to an engineer to further analyze the software and prior changes made to the software or to note a decrease, for instance, when a non-determinism issue has been corrected. Engineers may also be provided with certain tools to assist in their review of the data, such as a dashboard where engineers can query and find examples of specific non-determinism, including the scenario to run to reproduce the issue as well as an example difference between the values of the messages that were detected to be different. By examining the distribution and magnitude of change over different versions, this may assist engineers in prioritizing areas of the software for revisions to increase determinism.

Figure 4:
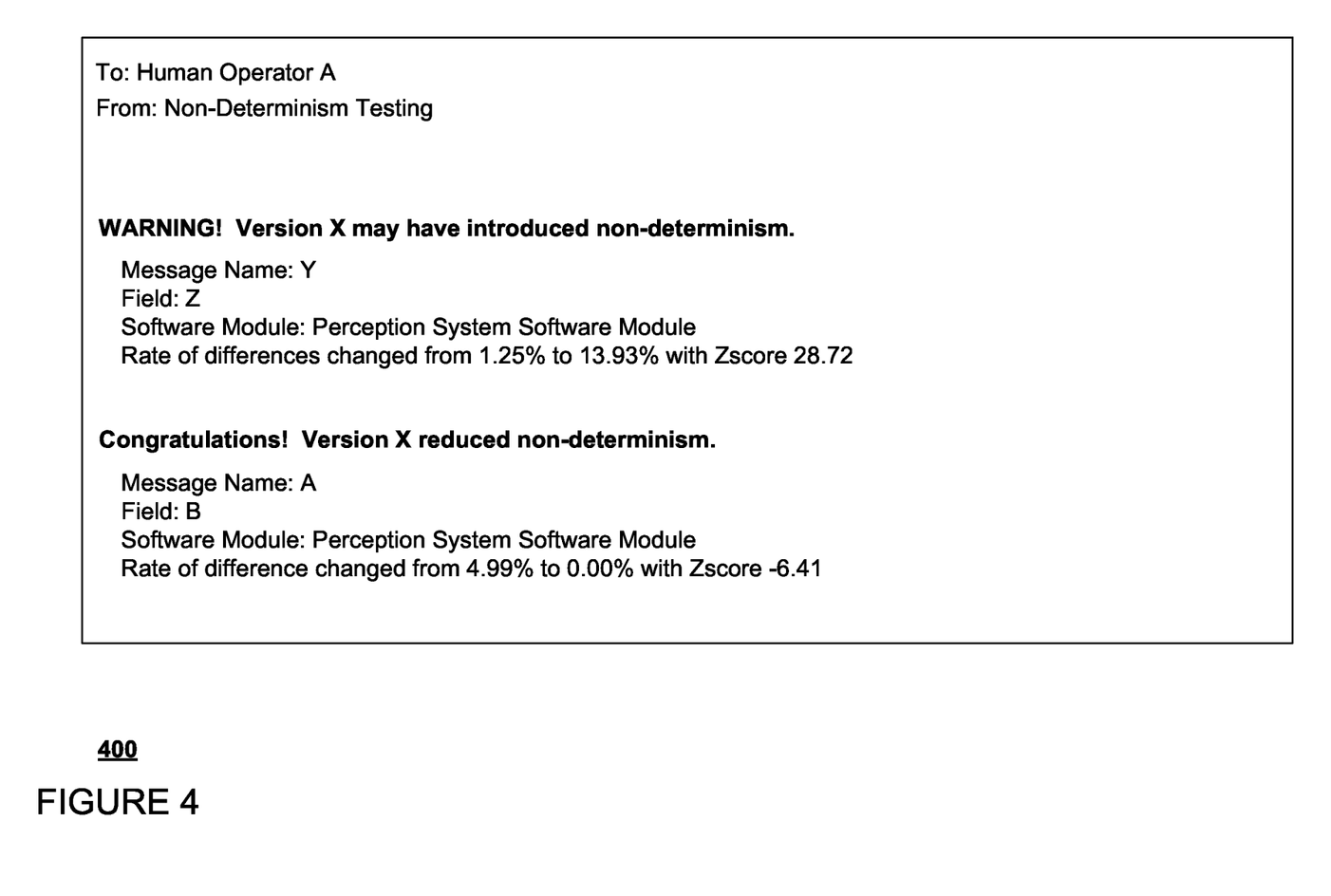
FIG. 4 is an example email in accordance with aspects of the disclosure.

For instance, FIG. 4 provides an example email 400 meant to be reviewed by a human operator, such as user 142 of client computing device 140. As shown example email 400 includes a warning that non-determinism has been detected. As such, the email 400 information identifying the software version (here, version "X"), the message and message field (here, message "Y" and field "7"), as well as other information such as the software module that produced the message (here, perception system software module), the rate of differences between different simulations run using the software, and the corresponding "Zscore". Here, the Zscore provides a number of standard deviations away from the current rate of non-determinism for a given message is away from the average rate of non-determinism for that message over recent history. In this regard, the Zscore may provide a measure of the significance of the anomaly that was detected. A higher Zscore (in absolute value) may mean a more severe anomaly, and a lower Zscore may mean a less severe anomaly. In addition, email 400 also includes information identifying a decrease in non-determinism, for instance over a prior version of the software. As such, the email includes information identifying the message and message field (here, message "A" and field "B") as well as the software modules that produced the message (here, the perception system software module) and the rate of differences between different version of the software and the corresponding "Zscore". Further, although the example of FIG. 4 relates to perception system software modules messages, similar information may be provided for messages flagged as causing a detected anomaly for various other software modules related to non-determinism.

The features described herein allow for the detection of non-determinism each time a change is made to autonomous vehicle software. In addition by discarding some messages or portions of messages that may exhibit differences unrelated to determinism in the vehicle's decisions or behaviors to focus on identifying important differences, the processing required may be reduced. As noted above, tolerances can be set to identify only certain amounts of differences which are likely to be problematic rather than all differences which would be significantly less useful. This approach can help to identify situations in which perception objects appear different and planned trajectories are different which can allow engineers to better identify and address problems with the software. In addition, having significant non-determinism in the software greatly reduces confidence when testing the software. For example, if the software, when running the same simulation again and again, gets into a collision 1 out of a 100 times with no changes to the input or the software, the safety of the software may be considered questionable. Intuitively, if a system is non-deterministic one must be concerned that a test related to the vehicle's decisions or behaviors passed out of chance as opposed to the software actually being good.

Unless otherwise stated, the foregoing alternative examples are not mutually exclusive, but may be implemented in various combinations to achieve unique advan-

The invention claimed is:

1. A method comprising:
    selecting, by one or more processors, a portion of log data stored in one or more memory devices that was generated by one or more sensors of a perception system of a vehicle;
    retrieving, by the one or more processors, the portion of log data from the one or more memory devices;
    running, by the one or more processors, a first simulation using software and the retrieved portion of log data;
    tracking, by the one or more processors, messages generated by the software during the first simulation including first messages that are related to non-determinism in the software and second messages that are not related to non-determinism in the software;
    running, by the one or more processors, a second simulation using the software and the retrieved portion of log data;
    tracking, by the one or more processors, messages generated by the software during the second simulation including third messages that are related to non-determinism in the software and fourth messages that are not related to non-determinism in the software;
    comparing, by the one or more processors, one or more fields of the first messages that were generated by the software during the first simulation with one or more fields of the third messages that were generated by the software during the second simulation; and
    based on a result of the comparing, detecting, by the one or more processors, a difference between the one or more fields of the first messages that were generated by the software during the first simulation and the one or more fields of the third messages that were generated by the software during the second simulation that is indicative of non-determinism in the software.

2. The method of claim 1, further comprising, prior to comparing the fields of the first messages with the one or more fields of the third messages, filtering the second messages and the fourth messages to remove fields unrelated to non-determinism such that only corresponding fields related to non-determinism are compared when comparing the one or more fields of the first messages with the one or more fields of the third messages.

3. The method of claim 1, wherein the difference indicative of non-determinism is a first difference in time between fields of corresponding first messages of the first simulation and the third messages of the second simulation.

4. The method of claim 1, wherein comparing the one or more fields of the first messages with the one or more fields of the third messages is based on a tolerance for acceptable differences between corresponding fields of the first messages and the third messages.

5. The method of claim 1, further comprising, identifying a software module of the software that caused the software to behave non-deterministically based on the difference.

6. The method of claim 1, further comprising, determining based on the difference a percentage of plurality of simulations for which the software behaves non-deterministically.

7. The method of claim 1, further comprising, flagging the first and second messages for review.

8. The method of claim 1, wherein the software is a latest version of the software, and the method further comprising, aggregating differences identified from prior versions of the software over time in order to detect anomalies in the latest version of the software.

9. The method of claim 8, wherein a detected anomaly indicates an increase in non-determinism from the latest version of the software over the prior versions of the software.

10. The method of claim 8, wherein a detected anomaly indicates a decrease in non-determinism from the latest version of the software over the prior versions of the software.

11. The method of claim 1, wherein the messages are generated by a decision making module of the software, which is a planning system configured to generate trajectories for the vehicle to follow.

12. The method of claim 1, wherein the messages are generated by the perception system, which is configured to detect and identify objects in an environment of the vehicle using sensor data generated by the one or more sensors.

13. The method of claim 1, wherein the messages are generated by a decision making module of the software, which is a behavior prediction system configured to predict future behaviors of objects detected in an environment of the vehicle from sensor data generated by the one or more sensors.

14. The method of claim 1, wherein the messages are generated by a decision making module of the software, which is a construction zone detection system configured to detect construction zones from sensor data generated by the one or more sensors.

15. The method of claim 1, wherein the messages are generated by a decision making module of the software, which is an emergency vehicle detection system configured to detect emergency vehicles from sensor data generated by the one or more sensors.

16. The method of claim 1, wherein the messages are generated by a decision making module of the software, which is a control system configured to control movement of the vehicle in order to follow a trajectory.

17. The method of claim 1, wherein the portion of log data corresponds to a period of time during which the log data was generated by the one or more sensors.

18. The method of claim 1, further comprising:
    identifying, by the one or more processors, a cause of the non-determinism based on the result of the comparing.

19. The method of claim 18, wherein the cause is a planner software module or a perception software module of the software.

20. A system comprising:
    one or more processors configured to:
        select a portion of log data stored in one or more memory devices that was generated by one or more sensors of a perception system of a vehicle;
        retrieve the portion of log data from the one or more memory devices;
        run a first simulation using software and the retrieved portion of log data;

track messages generated by the software during the first simulation including first messages that are related to non-determinism in the software and second messages that are not related to non-determinism in the software;

run a second simulation using the software and the retrieved portion of log data;

track messages generated by the software during the second simulation including third messages that are related to non-determinism in the software and fourth messages that are not related to non-determinism in the software;

compare one or more fields of the first messages that were generated by the software during the first simulation with one or more fields of the third messages that were generated by the software during the second simulation; and based on a result of the comparison, detect a difference between the one or more fields of the first messages that were generated by the software during the first simulation and the one or more fields of the third messages that were generated by the software during the second simulation that is indicative of non-determinism in the software.

21. The system of claim 20, wherein the one or more processors are further configured to, prior to comparing the one or more fields of the first messages with the one or more fields of the third messages, filter the second messages and the fourth messages to remove fields unrelated to non-determinism such that only corresponding fields related to non-determinism are compared when comparing the one or more fields of the first messages with the one or more fields of the third messages.

22. The system of claim 20, wherein the difference indicative of non-determinism is a first difference in time between fields of corresponding first messages of the first simulation and the third messages of the second simulation.

23. The system of claim 20, wherein comparing the one or more fields of the first messages with the one or more fields of the third messages is based on a tolerance for acceptable differences between corresponding fields of the first messages and the third messages.

24. The system of claim 20, wherein the portion of log data corresponds to a period of time during which the log data was generated by the one or more sensors.

* * * * *

UNITED STATES PATENT AND TRADEMARK OFFICE
CERTIFICATE OF CORRECTION

| | | |
|---|---|---|
| PATENT NO. | : 12,387,017 B1 | Page 1 of 1 |
| APPLICATION NO. | : 16/174890 | |
| DATED | : August 12, 2025 | |
| INVENTOR(S) | : Aleksandar Rumenov Gabrovski and Andrew Hughes Chatham | |

It is certified that error appears in the above-identified patent and that said Letters Patent is hereby corrected as shown below:

In the Claims

Claim 2, Column 11, Line 52:
Now reads: "the fields of the first messages" should read -- the one or more fields of the first messages --

Signed and Sealed this
Eleventh Day of November, 2025

John A. Squires
*Director of the United States Patent and Trademark Office*